(12) United States Patent
Yang et al.

(10) Patent No.: US 9,412,721 B2
(45) Date of Patent: Aug. 9, 2016

(54) CONTACTLESS COMMUNICATIONS USING FERROMAGNETIC MATERIAL

(71) Applicant: Taiwan Semiconductor Manufacturing Co., Ltd., Hsin-Chu (TW)

(72) Inventors: Ping-Lin Yang, Tianzhong Township (TW); Jun-De Jin, Hsinchu (TW); Fu-Lung Hsueh, Kaohsiung (TW); Sa-Lly Liu, HsinChu (TW); Tong-Chern Ong, Chong-Her (TW); Chun-Jung Lin, HsinChu (TW); Ya-Chen Kao, Fuxing Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 22 days.

(21) Appl. No.: 14/280,732

(22) Filed: May 19, 2014

(65) Prior Publication Data
US 2014/0256063 A1    Sep. 11, 2014

Related U.S. Application Data

(62) Division of application No. 13/206,584, filed on Aug. 10, 2011, now Pat. No. 8,760,255.

(51) Int. Cl.
*H01F 5/00* (2006.01)
*H01L 25/065* (2006.01)
*H01F 27/28* (2006.01)
(Continued)

(52) U.S. Cl.
CPC .............. *H01L 25/0657* (2013.01); *H01F 5/00* (2013.01); *H01F 27/2804* (2013.01); *H01F 41/046* (2013.01); *H01L 23/48* (2013.01); *H01L 23/5227* (2013.01); *H01F 2027/2809* (2013.01);
(Continued)

(58) Field of Classification Search
CPC .......................... H01F 27/00–27/30; H01F 5/00
USPC ......... 336/65, 84 R, 84 M, 200, 220–223, 232
See application file for complete search history.

(56) References Cited

U.S. PATENT DOCUMENTS

| | | | | |
|---|---|---|---|---|
| 4,253,079 A | * | 2/1981 | Brosh | G01D 5/2046 336/136 |
| 5,396,101 A | * | 3/1995 | Shiga | H01F 17/0006 257/528 |

(Continued)

OTHER PUBLICATIONS

Asao, Y. et al., "Design and Process Integration for High-Density, High-Speed, and Low-Power 6F2 Cross Point MRAM Cell", IEEE International Electron Devices Meeting, 2004, IEDM Technical Digest, pp. 571-574.

(Continued)

*Primary Examiner* — Tuyen Nguyen
(74) *Attorney, Agent, or Firm* — Duane Morris LLP; Steven E. Koffs (57) ABSTRACT

A communications structure comprises a first semiconductor substrate having a first coil, and a second semiconductor substrate having a second coil above the first semiconductor substrate. Inner edges of the first and second coils define a boundary of a volume that extends below the first coil and above the second coil. A ferromagnetic core is positioned at least partially within the boundary, such that a mutual inductance is provided between the first and second coils for wireless transmission of signals or power between the first and second coils.

20 Claims, 11 Drawing Sheets

(51) Int. Cl.
  *H01F 41/04* (2006.01)
  *H01L 23/522* (2006.01)
  *H01L 23/48* (2006.01)

(52) U.S. Cl.
  CPC ............... *H01L 2225/06531* (2013.01); *H01L 2924/0002* (2013.01); *Y10T 29/4902* (2015.01)

(56) References Cited

U.S. PATENT DOCUMENTS

| | | | |
|---|---|---|---|
| 5,852,866 A | | 12/1998 | Kuettner et al. |
| 5,936,298 A | * | 8/1999 | Capocelli ............ H01F 17/0033 257/531 |
| 5,945,902 A | * | 8/1999 | Lipkes ................ H01F 17/0013 29/602.1 |
| 6,362,012 B1 | | 3/2002 | Chi et al. |
| 6,480,086 B1 | * | 11/2002 | Kluge ................ H01F 17/0013 257/E21.022 |
| 7,262,680 B2 | | 8/2007 | Wang |
| 7,795,713 B2 | | 9/2010 | Matsui |

OTHER PUBLICATIONS

Durlam, M. et al., "A 1-Mbit MRAM Based on 1T1MTJ Bit Cell Integrated With Copper Interconnects", IEEE Journal of Solid-State Circuits, May 2003, 38(5):769-773.

Tehrani, S. et al., "Progress and Outlook for MRAM Technology", IEEE Transactions on Magnetics, Sep. 1999, 35(5):2814-2819.

Radecki, A. et al., "6W/25mm2 Inductive Power Transfer for Non-Contact Wafer-Level Testing", IEEE International Solid-State Circuits Conference, 2011, Session 12, Design in Emerging Technologies, 12.8, pp. 230-232.

Han, S. et al., "Performance Improvement of Resonant Inductive Coupling for Wireless 3D IC Interconnect", IEEE Antennas and Propagation Society International Symposium (APSURSI), 2010, pp. 1-4.

Han, S. et al., "Wireless Power Transfer Using Resonant Inductive Coupling for 3D Integrated ICs", Electrical Engineering and Computer Science Department, The University of Michigan, Ann Arbor, pp. 1-5, www.eecs.umich.edu/wics/publications.html—Cached.

* cited by examiner

CONTACTLESS COMMUNICATIONS USING FERROMAGNETIC MATERIAL

This application is a division of U.S. patent application Ser. No. 13/206,584, filed Aug. 10, 2011, which is expressly incorporated by reference herein in its entirety.

FIELD

This disclosure relates to a semiconductor integrated circuit having an on-chip inductor for contactless communication.

BACKGROUND

A 3D package contains two or more integrated circuits (ICs) stacked vertically so that they occupy less space. Connections between the vertically stacked ICs may be made using through-silicon-vias (TSV), which pass through the entire thickness of a die, permitting connections between conductive patterns on the front face and back face of the die. The resulting package has no added length or width. Because no interposer is required, a 3D package using TSVs can be flatter than an edge-wired 3D package.

For 3D IC, power TSV are typically used for transferring power. The processing steps to form TSVs increase the cost of fabricating the IC. In addition, there is an area penalty for adding these TSVs, because the space occupied by the TSVs cannot be used for any other circuitry.

An alternative packaging technique is the so called "2.5D IC", in which plural IC chips are mounted on a silicon interposer. The interconnections between the various functional ICs and the silicon interposer are made using microbumps (μ-bumps), which are typically on the order of 15-50 micrometers. The μ-bumps are much smaller and more fragile than the solder bumps which are used to join an IC directly to a package substrate. During wafer acceptance test and/or individual die testing, the μ-bumps may be directly accessed by a probe card for testing. There is thus a potential for the μ-bumps to be damaged.

DETAILED DESCRIPTION

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

An alternative technique for communications among the various ICs in a stacked package is the use of contactless (wireless) connections. For example, a planar coil having one or more turns may be formed in the back end of line (BEOL) interconnect layers of each of the substrates. The respective coils in two aligned substrates have a mutual inductance that allows transfer of electromagnetic radiation between them. In other embodiments, there are other types of non-planar coil structures on-chip. For example, the coil may be in the form of a a helix formed in multiple metal layers. The helix may include, for example, a plurality of open rectangles or octagons having their ends in adjacent layers connected by conductive vias. Similarly, an inductor on a first IC (packaged or unpackaged) may provide contactless communication to an external second inductor, which may also be packaged or unpackaged.

A larger mutual inductance improves the signal and power transferring quality and efficiency of a pair of inductors. Two options for increasing mutual inductance are to increase: (1) the number of turns in the inductors and/or (2) the size of each turn. Both of these options may increase the inductor area relative to smaller coils. For 3D IC application, coil-to-coil distance is mainly determined by chip thickness. In some circumstances, it may be possible to locate the coils closer to each other (e.g., by thinning the back face of one of the substrates during processing), but in other embodiments, the thickness of the substrate is constrained (for example, to maintain at least a predetermined substrate thickness to avoid substrate cracking) Larger coils reduce the number of coils that can be located in a given area, and channel count is limited.

In some embodiments described below, mutual inductance is increased by including one or more cores of a ferromagnetic material within a 3D IC or 2.5D IC package. In various embodiments, the inclusion of a core of ferromagnetic material may increase the mutual inductance between coils in two adjacent substrates by about 30%, relative to an otherwise similar configuration without the ferromagnetic material. In various embodiments, ferromagnetic materials may be included on at least one IC chip to improve inductor's performance for power delivery and/or signal communication. The at least one IC may be packaged or unpackaged. The ferromagnetic material improves the performance of contactless communication which is established by magnetic coupling between coils. The second coil may be on a second chip, or may be a discrete coil that is not formed as part of an IC.

FIGS. 1-6 are schematic diagrams showing examples of relative locations among a first (bottom) coil, a second (top) coil, and a mass of ferromagnetic material. In some embodiments, the coils and ferromagnetic material are contained with a package (e.g., a 3D IC package or a 2.5D IC package. Other elements of the packages (e.g., the semiconductor substrates) are omitted from FIGS. 1-6, for ease of viewing. In other embodiments, the first IC having the first coil may be unpackaged (e.g., for directly probing a bare-die); and the second coil may either be included on a packaged or unpackaged second IC or a discrete inductor.

Figure 1A:
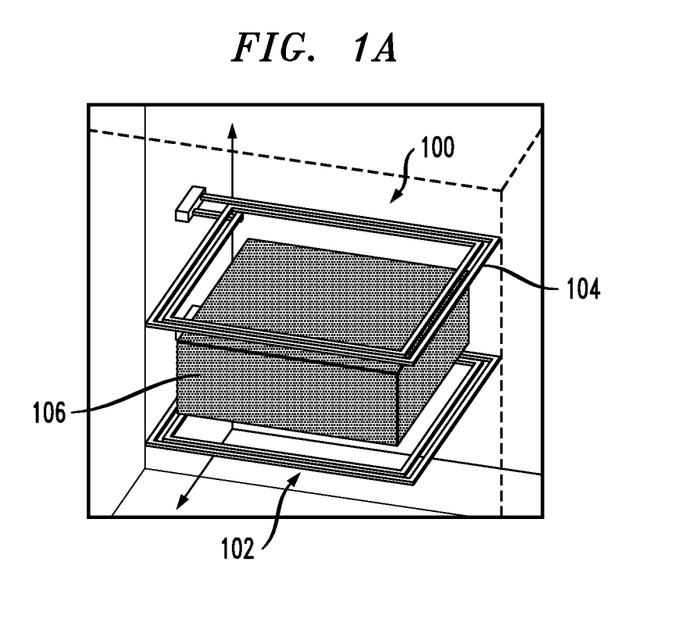
FIGS. 1A-1B show a contactless communication structure having a ferromagnetic core.
Figure 1B:
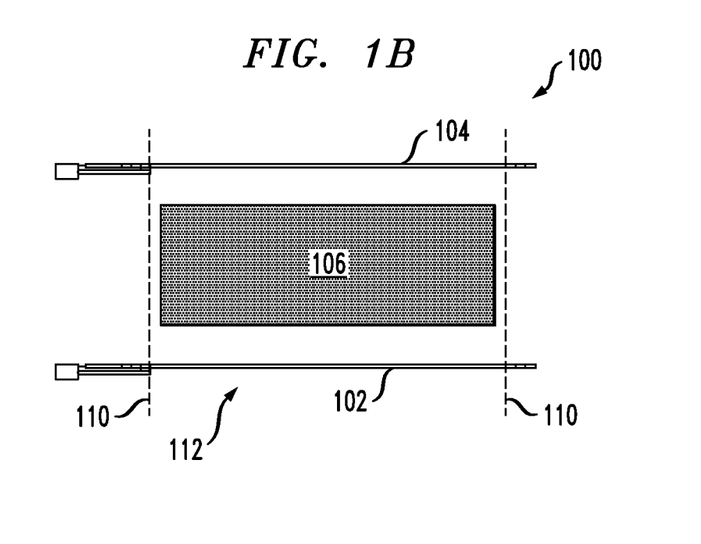

FIGS. 1A and 1B show an embodiment of a communications structure 100, comprising: a first (bottom) coil 102, a second (top) coil 104 above the first coil, and a mass of ferromagnetic material 106. The coils are included with respective semiconductor substrates (described below with reference to FIGS. 7 and 8).

The inner edges of the first and second coils 102, 104 define a boundary 110 of a volume 112 that extends below the first coil 102 and above the second coil 104.

A ferromagnetic core 106 is positioned at least partially within the boundary 110, such that a mutual inductance is provided between the first and second coils 102, 104 for wireless transmission of signals or power between the first and second coils.

In some embodiments, the ferromagnetic core 106 comprises at least one of the group consisting of CoFe, CoFeB, NiFe, and NiFeCo. Alternatively, other ferromagnetic materials may be used.

Although FIG. 1A shows rectangular windings, the windings may be of any shape (e.g., circular, octagonal or the like).

FIGS. 1A and 1B show an example in which the ferromagnetic core 106 is entirely contained between the coils, above the top of the bottom coil 102 and below the bottom of the top coil 104. FIG. 1A is an isometric view, and FIG. 1B is a side elevation view.

In other embodiments, the top of the core 106 is above the top surface of the top coil 104. In some embodiments, the bottom of the core 106 is below the bottom surface of the bottom coil 102. The core 106 may extend laterally (in FIG. 1B, left, right, into the page or out of the page) beyond the boundary 110 of the volume 112.

Figure 2:
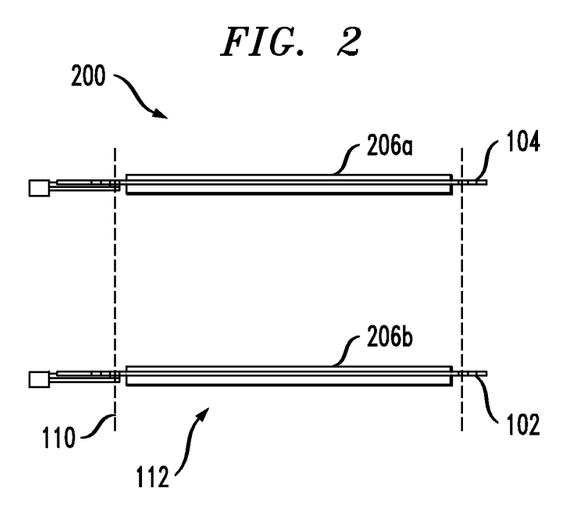
FIG. 2 shows a contactless communication structure having two ferromagnetic cores.

For example, FIG. 2 shows another example, in which a respective core 206a, 206b is provided for each respective coil 104, 102. These cores 206a, 206b are thin relative to the core of FIGS. 1A, 1B. The ferromagnetic cores 206a, 206b have a thickness greater than a thickness of the first coil 102.

In FIG. 2, each core 206a, 206b extends above and below its respective coil 104, 102, asymmetrically. In FIG. 2, the cores 206a, 206b extend further below their respective coils 104, 102 than they extend above the coils (i.e., the centroids of the cores are below the coils).

In other embodiments, the cores 206a, 206b extend further above their respective coils 104, 102 than they extend below the coils (i.e., the centroids of the cores are above the coils). In some embodiments, the centroid of core 206a is below the coil 104, and the centroid of core 206b is above the coil 102, so that a larger portion of the ferromagnetic material is located between the coils 104, 102 than is located above the top coil 104 or below the bottom coil 102. In other embodiments, the centroid of core 206a is above the coil 104, and the centroid of core 206b is below the coil 102, so that a smaller portion of the ferromagnetic material is located between the coils 104, 102 than is located above the top coil 104 or below the bottom coil 102.

Figure 3:
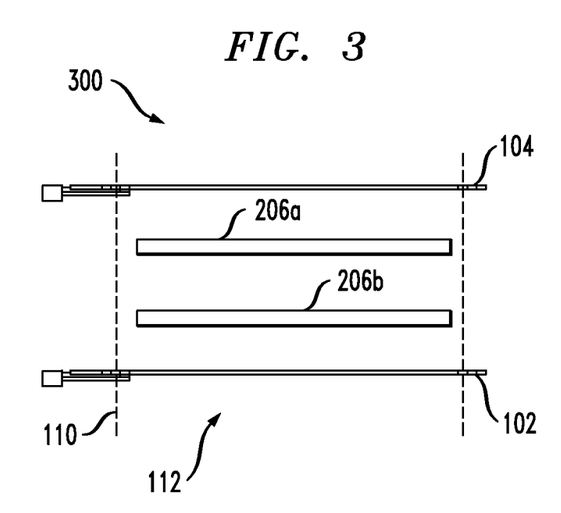
FIG. 3 shows a contactless communication structure having two ferromagnetic cores.

FIG. 3 shows another example, in which respective cores 206a, 206b are provided for each respective coil 104, 102. In the example of FIG. 3, each of the cores 206a, 206b is contained entirely within the volume bounded by the inner boundary 110 of the coils 104, 102 and the plane containing each of the coils. Further, both cores 206a, 206b are above the top of bottom coil 102 and below the bottom of top coil 104. With two coils 104, 102 having two thin ferromagnetic cores 206a, 206b in between, the shielding effect may be used to control the magnetic flux direction by arranging the location of the cores.

Figure 4A:
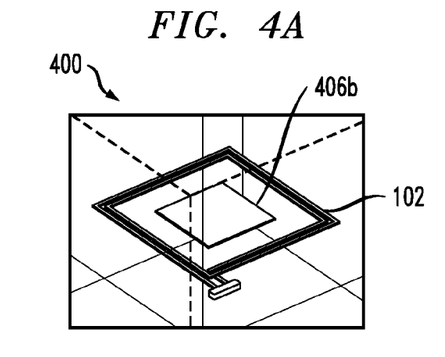
FIG. 4A-4B show a contactless communication structure having a thin film ferromagnetic core.
Figure 4B:
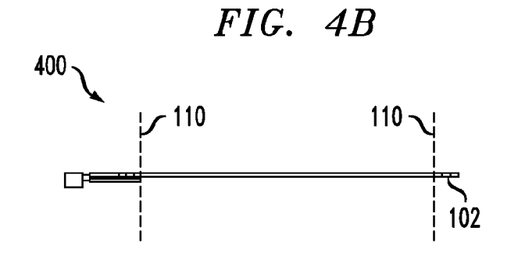

FIGS. 4A and 4B shows an example in which a core 406b is contained entirely within the inner boundary 110 of the coil 102, and has a thickness less than or equal to the thickness of the coil 102. Both these trenches can be etched to the same depth. In some embodiments, there is only a single coil 102 within the package, for connectionless communication to an external device. Although only one of the coils 102 and its respective core 406b are shown in FIGS. 4A and 4B, another coil and core (not shown) can be configured in the same way within the package. Thus, the core 406b of FIG. 4A may be included within a single one of the coils 102, or in both of the coils 102, 104. In other embodiments, the core 406b may be included in more than two coils, if three or more coils are included.

Figure 5:
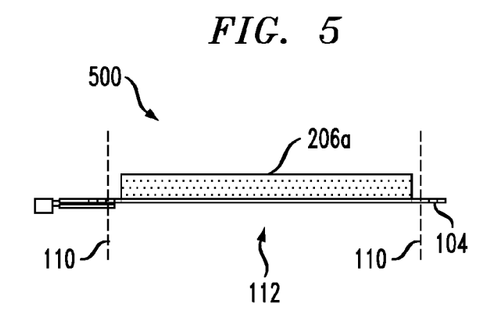
FIG. 5 show a contactless communication structure having an asymmetrically located ferromagnetic core.

FIG. 5 shows an example of a structure 500 in which the top ferromagnetic core 206a is entirely above the plane of the top coil 104. In some embodiments, there is only a single coil 104 within the package, such as, but not limited to providing connectionless communication to an external device. For example, a single core may be used for single inductor applications such as LC-tank or phased lock loop (PLL), to improve inductor performance. In other applications, a ferromagnetic core may be provided for improving other aspects of on-chip inductor performance.

Ferromagnetic cores can be used as magnetic shields reducing undesirable cross-talkIn other embodiments, another (bottom) ferromagnetic core (not shown) is entirely below the plane of the bottom coil 102.

Figure 6:
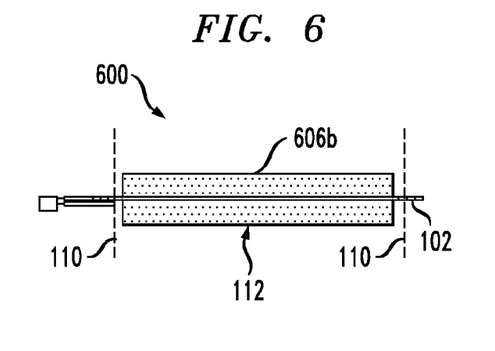
FIG. 6 show a contactless communication structure having a symmetrically located ferromagnetic core.

FIG. 6 shows an example of a structure 600 in which the ferromagnetic core 606b is located symmetrically (in the vertical direction) with respect to the bottom coil 102, with the centroid of the core 606b substantially at the same height as the centroid of the coil 102. In some embodiments, there is only a single coil 102 within the package, for connectionless communication to an external device. In other embodiments, another (top) ferromagnetic core (not shown) is symmetrically arranged about the plane of the top coil 104.

Figure 7:
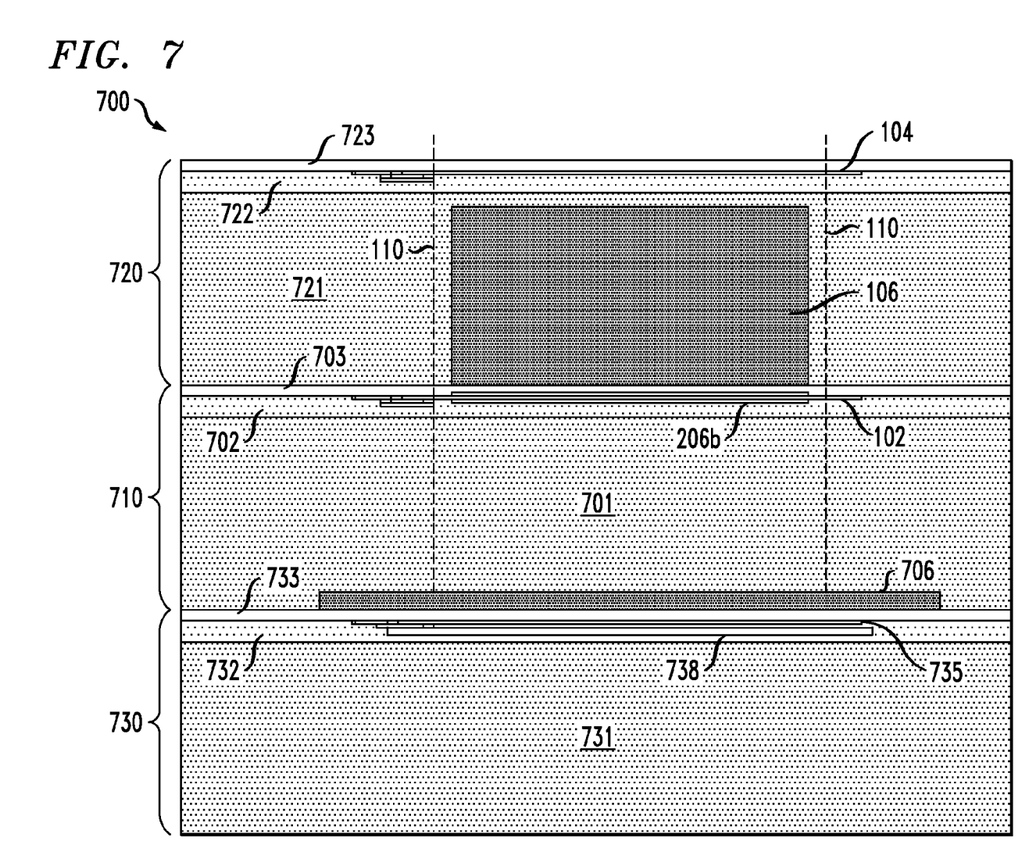
FIG. 7 shows a stacked structure having plural coils and ferromagnetic cores.

FIG. 7 shows an example of a chip stack 700 including the above described structure for wireless (connectionless) communication between chips.

The stack 700 includes a first chip 710 including a first semiconductor substrate 701 having a first coil 102. A second chip 720 includes a second semiconductor substrate 721 having a second coil 104, above the first semiconductor substrate 701. In some embodiments, a third IC chip 730 includes a third semiconductor substrate 731 having a third coil 735, below the first semiconductor substrate 701. In some embodiments, the first semiconductor substrate 701, second semiconductor substrate 721 and third substrate 731 are all integrated circuit dies housed within a single 3D communications structure. In other embodiments, item 730 is a semiconductor (e.g., silicon) interposer having a third semiconductor substrate 731 and a third coil 735 and the substrates 701, 721, 731 are housed within a single 2.5D communications structure (which may include other dies, not shown, on the interposer 731).

Each substrate 701, 721, 731 has a respective interconnect structure 702, 722 and 732, respectively, including conductive circuit patterns and vias (not shown). Each interconnect structure 702, 722, 732 includes a plurality of back end of line (BEOL) inter-metal dielectric (IMD) layers. Each coil 102, 104, 735 is formed in a respective IMD layer over its respective substrate 701, 721, 731. Each chip 710, 720, 730 has a respective passivation layer 703, 723, 733 above its interconnect structure 702, 722, 732.

Inner edges 110 of the first coil 102 and second coil 104 define a boundary of a volume that extends below the first coil 102 and above the second coil 104.

A ferromagnetic core 106 is positioned at least partially within the boundary 110, such that a mutual inductance is provided between the first coil 102 and second coil 104 for wireless transmission of signals or power between the first and second coils 102, 104. The core 106 may be any of the cores described above with reference to FIGS. 1 to 6. In FIG. 7, the core 106 is the same as the core shown in FIGS. 1A and 1B, and its description is not repeated.

In FIG. 7, the core 106 is entirely contained within chip 720. To provide the core 106, an opening is formed (e.g., by drilling or etching) from the back-side of chip 720. The opening may have a variety of depths and sizes. The ferromagnetic material of core 106 may be provided in the opening by a bulk fill process, or by forming an insert 106 made of the material, and placing the insert in the opening.

In the example of FIG. 7, a second ferromagnetic core 206b is provided over the first substrate 701. In this example, the core 206b is a relatively thin core similar to the cores 206b (FIG. 2). Alternatively, the core 206b in FIG. 7 may be replaced with a core similar to those shown in FIG. 4A or FIG. 5. In some embodiments, the core 206b may be formed using a similar deposition process step (e.g., sputtering or etching) to that used for depositing a thin film of ferromagnetic material in the magnetic tunnel junction (MTJ) of a magnetoresistive random access memory (MRAM).

Additionally, the first substrate 701 may have a ferromagnetic core 706 in its back face for improving the mutual inductance between the first coil 102 and the third coil 735. In this example, the core 706 is entirely contained within the back face of the first die 102, below the bottom of coil 102 and above the top of the third coil 735. A portion of the ferromagnetic core 706 extends beyond an outer edge of at least one of the group consisting of the first winding and the second winding. In the example of FIG. 7, the core 706 extends laterally (left and right) past the boundary 110 defined by the inner edges of coils 102 and 735.

In the example of FIG. 7, the third substrate 731 has an additional ferromagnetic core 738 formed in the interconnect layers above the substrate. Like the core 706, the core 738 extends laterally (left and right) past the boundary 110 defined by the inner edges of coils 102 and 735. In the case of core 738, the core is formed entirely within one of the BEOL IMD layers of the interconnect structure 732. Core 738 also provides an example of a ferromagnetic core that is located below the bottom coil 735, so that the core 738 is not positioned between the heights of coils 102 and 735.

Figure 8:
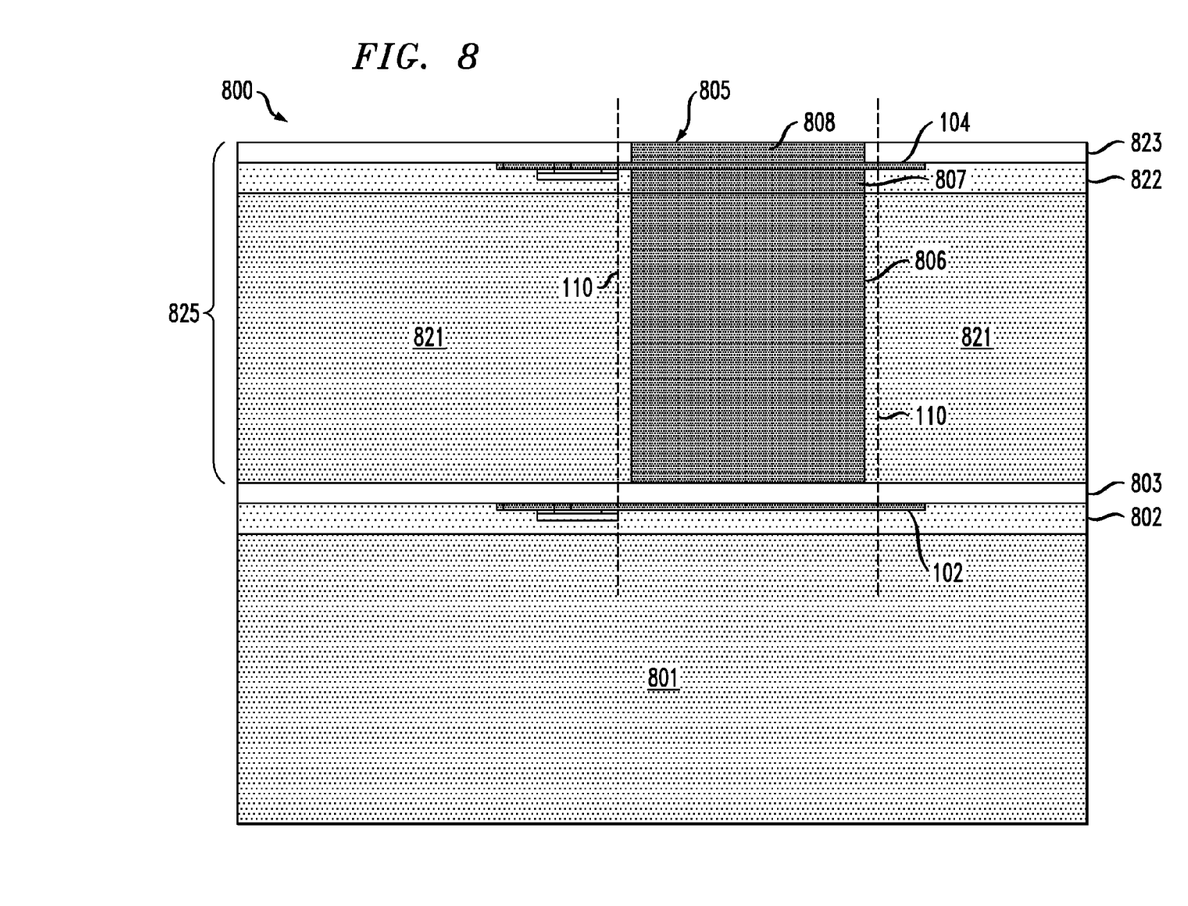
FIG. 8 shows a stacked structure having plural coils and a ferromagnetic core.

FIG. 8 is a cross sectional view of another example of a communications structure 800. In FIG. 8, a first substrate 801 may be a bottom chip in a 3D IC system. Alternatively, substrate 801 may be a semiconductor (silicon) interposer in a 2.5D system. Substrate 801 has an interconnect structure 802 comprising metal-containing IMD layers and via-containing IMD layers formed over the substrate. A passivation layer 803 is formed over the interconnect structure 802. The first coil 102 is formed within the interconnect structure 802, for example in the top IMD layer.

The second substrate 821 is the substrate of an IC chip 825. Substrate 821 has an interconnect structure 822 comprising metal-containing IMD layers and via-containing IMD layers formed over the substrate. A passivation layer 823 is formed over the interconnect structure 822. The second coil 104 is formed in the interconnect structure 822. Although FIG. 8 only shows two substrates 801 and 821, one or more additional ICs may be stacked above the passivation layer 823.

In the example of FIG. 8, the ferromagnetic core 805 extends completely through the IC chip 825, from the front face to the back face of the chip. The opening in which the ferromagnetic material 805 is deposited may be formed by a process that forms an opening for a TSV. Alternatively, the opening may be drilled. The second coil 104 is a conductive pattern formed as part of a second interconnect structure 822 above the second semiconductor substrate 821, and the ferromagnetic core 805 is partially contained in the second semiconductor substrate 821 within the boundary 110. The ferromagnetic core 805 is at least partially contained in an inter-metal dielectric layer of the second interconnect structure 822. The ferromagnetic core 805 is at least partially contained in a passivation layer 823 above the second interconnect structure 822. The core 805 includes a first portion 806 within the second substrate 821, a second portion 807 within the IMD layers of the interconnect structure, and a third portion 808 within the passivation layer 823.

In some embodiments, an opening is formed through the substrate 821, IMD layers of interconnect structure 822 and the passivation layer 823 in a single step by etching or drilling. Then the ferromagnetic material is applied in a bulk fill process.

FIGS. 7 and 8 are only examples. The ferromagnetic cores may be used to improve mutual inductance between coils in any combination of IC chips and silicon interposers.

Although the core 805 terminates at the top surface of the passivation layer 823, in other embodiments, the core 805 extends upward beyond the top surface of passivation layer 823. This may improve mutual inductance between the coil 104 and another coil (not shown) external to the IC package in which the stack 800 is contained.

Figure 9A:
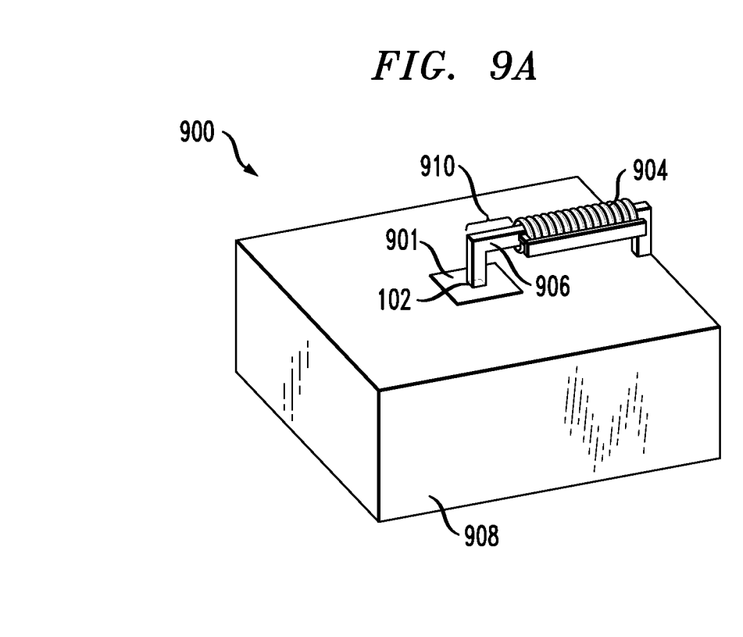
FIGS. 9A and 9B show a structure having a semiconductor coil, an external coil and a magnetic core.
Figure 9B:
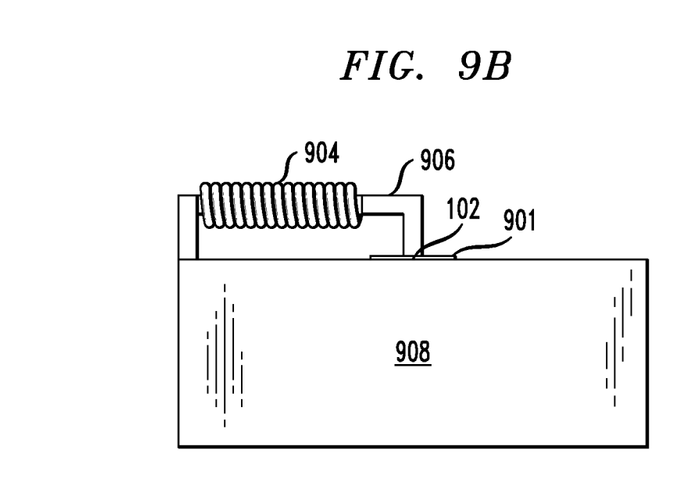

FIGS. 9A and 9B show an example of a structure comprising: a first semiconductor substrate 901 having a first planar coil 102; and a second coil 904 located apart from the first substrate. A ferromagnetic core 906 is positioned at least partially between the first coil 102 and the second coil 904. The ferromagnetic core 906 has a first portion on the first coil 102 and a second portion inside or adjacent the second coil 904. The first coil 102 and second coil 904 having a mutual inductance for wireless transmission of signals or power between the first and second coils.

In structure 900, the second coil 904 is located external to the IC package in which the first coil 102 is to be installed. The first coil 102 is contained in an IC chip 901. The second coil 904 may be a helical coil as shown, or may be configured differently. For example, the second (off-chip) coil may alternatively be flat coil in a second IC package (not shown). A mass 906 of ferromagnetic material is provided along the path of magnetic flux. For example, the ferromagnetic material may be in the region 910 between the first coil 102 and the second coil 904. The ferromagnetic material may be inside the second coil 904. In the example of FIGS. 9A and 9B, the IC chip 901 is mounted over a plate 908 of ferromagnetic material, and the mass 906 of magnetic material extends substantially continuously from the first coil 102 to, through and past the second coil 904, to connect with the plate 908. The ferromagnetic mass 906 begins a distance above the IC chip 901, where the distance depends on the packing of IC chip 901. The ferromagnetic mass 906 forms the pole and arms of a magnetic circuit.

Figure 10A:
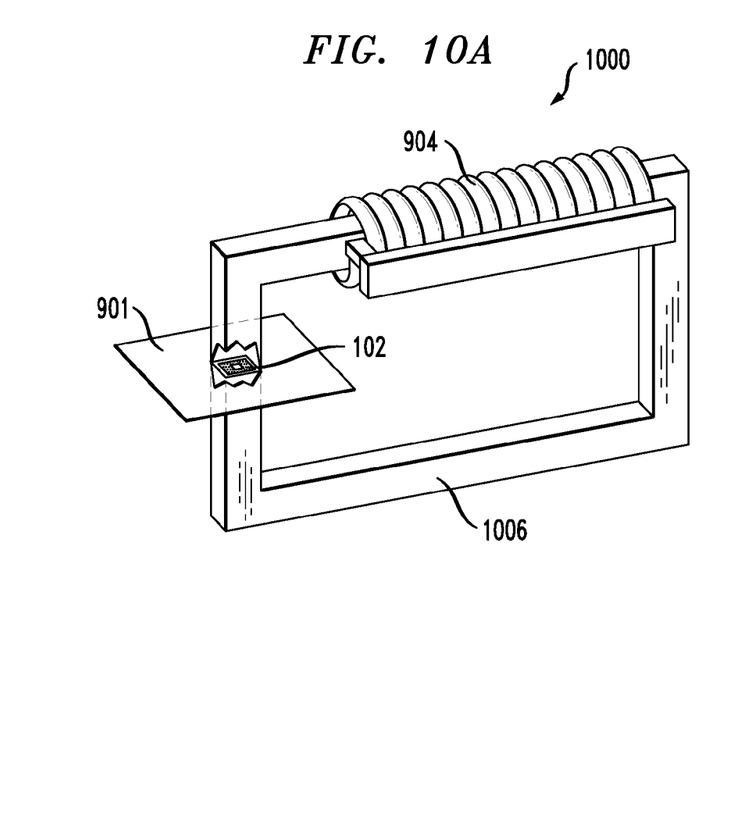
FIGS. 10A and 10B show another structure having a semiconductor coil, an external coil and a magnetic core.
Figure 10B:
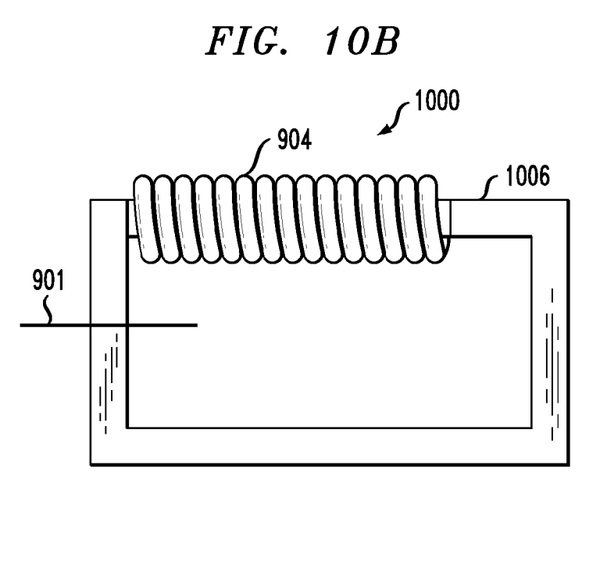

FIGS. 10A and 10B show another example of a structure 1000 in which the second coil 904 is located external to the IC package in which the first coil 102 is to be installed.

The first coil 102 is contained in an IC chip 901. The second coil 904 may be a helical coil as shown, or may be configured differently. A mass 1006 of ferromagnetic material is provided along the path of magnetic flux, in a closed magnetic loop configuration. The mass 1006 of magnetic material extends substantially continuously from above the first coil 102 to, through and past the second coil 904, to the bottom of the IC chip 901. The ferromagnetic mass 906 forms the pole and arms of a magnetic circuit.

Thus, flux direction can be controlled by properly arranging the ferromagnetic cores. Core size, location, counts, distributions, and material type may all be configured for a particular application.

Figure 11:
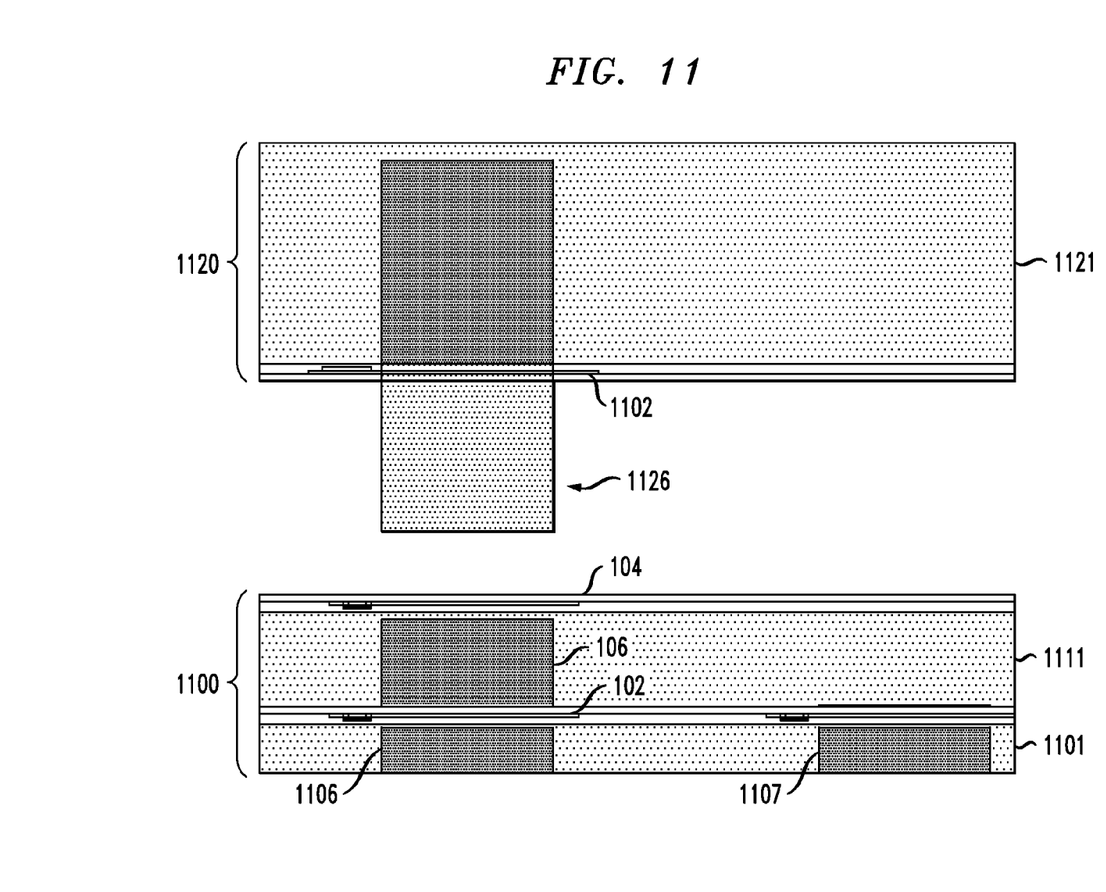
FIG. 11 shows another stacked structure having plural coils and a ferromagnetic core.

FIG. 11 shows another example, in which a chip stack has a plurality of ferromagnetic cores, and connectionless communication is provided to an external semiconductor assembly 1120 (e.g., a piece of test equipment).

The first chip stack 1100 includes a first substrate 1101 having a first coil 102, a first ferromagnetic core 1106 and a second ferromagnetic core 1107. A second substrate 1111 has a second coil 104 and a ferromagnetic core 106. The first and second substrates 1101, 1111 are aligned and packaged. The external assembly 1120 includes a substrate 1121 having a coil 1102 and a ferromagnetic core 1126, which extends into the substrate 1121 and extends outwardly from the front face of assembly 1120.

Figure 12:
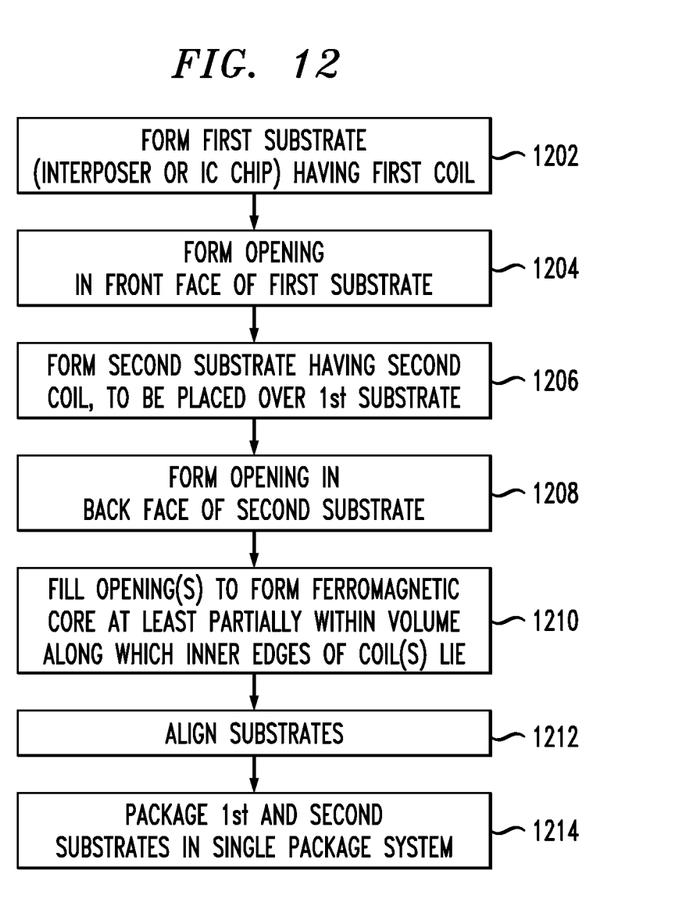
FIG. 12 is a flow chart of a method for forming a package having a ferromagnetic core for contactless communication.

FIG. 12 is a flow chart of a method for including a ferromagnetic core in a connectionless communication system to improve the mutual inductance between coils.

At step 1202, a first semiconductor substrate having a first coil is formed, for example using a CMOS process. For example, in one embodiment, the first semiconductor substrate has a front face and a back face, with a first interconnect structure on the front face, and the first coil is a part of the first interconnect structure.

At step 1204, an opening is formed in the front face (or back face, or both front and back faces) of the first substrate.

At step 1206, a second semiconductor substrate is formed, having a second coil. The second substrate is to be placed over the first semiconductor substrate. For example, in one embodiment, the second semiconductor substrate has an active face and a back face, with a second interconnect structure on the active face, wherein the second coil is a part of the second interconnect structure, and the back face of the second semiconductor substrate faces the front face of the first semiconductor substrate. In other embodiments, the front face of the second substrate faces the front face of the first substrate, and the first and second coils are formed on the front side of each of the first and second substrates. In other embodiments, the back face of the second substrate faces the back face of the first substrate, and the first and second coils are formed on the back side of each of the first and second substrates.

At step 1208, an opening is formed in the back face (or front face or both back and front faces) of the second substrate.

At step 1210, the openings are filled with a ferromagnetic material to form a ferromagnetic core at least partially located within a volume along which inner edges of the first and second coils lie, so as to increase a mutual inductance between the first and second coils for wireless transmission of signals or power. For example, in one embodiment, the step of providing the ferromagnetic cores includes forming a film of a ferromagnetic material inside the inner edge of the first coil; and providing a second ferromagnetic core, including forming an opening in the back face of the second semiconductor substrate, and filling the opening with the ferromagnetic material. In other embodiments, the film is positioned at other locations besides the inner edge of the first coil. In various embodiments, the film may be anywhere on the substrate.

In some embodiments, step 1210 includes forming a ferromagnetic film in an inter-metal dielectric layer during a complementary metal oxide semiconductor (CMOS) back end of line process. For example, a process step of the type used for forming a magnetic tunnel junction in a magnetoresistive RAM (MRAM) may be used.

At step 1212, the first and second substrates are aligned, so that the first and second coils are in appropriate alignment with each other for connectionless communication. For example in some embodiments, a winding of the IC die (second substrate) overlies a winding of the silicon interposer (first substrate).

At step 1214, the first and second semiconductor substrates and the ferromagnetic core are packaged in a single package.

Figure 13:
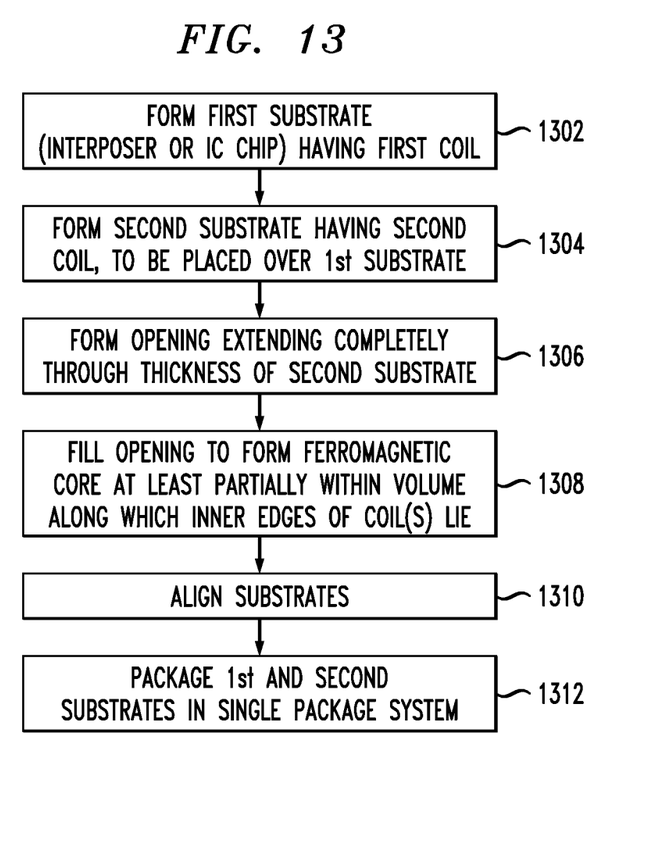
FIG. 13 is a flow chart of an alternative method for forming a package having a ferromagnetic core for contactless communication.

FIG. 13 is a flow chart of a variation of the method of FIG. 12.

At step 1302, a first semiconductor substrate having a first coil is formed, for example using a CMOS process. For example, in one embodiment, the first semiconductor substrate has a front face and a back face, with a first interconnect structure on the front face, and the first coil is a part of the first interconnect structure. In other embodiments, a ferromagnetic core can also be placed in the first semiconductor. For example, a trench may be formed in the front or back side of the bulk silicon of the first semiconductor substrate, and the trench filled with the ferromagnetic material.

At step 1304, a second semiconductor substrate is formed, having a second coil. The second substrate is to be placed over the first semiconductor substrate. For example, in one embodiment, the second semiconductor substrate has an active face and a back face, with a second interconnect structure on the active face, wherein the second coil is a part of the second interconnect structure, and the back face of the second semiconductor substrate faces the front face of the first semiconductor substrate. In other embodiments, the front face of the second substrate faces the front face of the first substrate, and the first and second coils are formed on the front side of each of the first and second substrates. In other embodiments, the back face of the second substrate faces the back face of the first substrate, and the first and second coils are formed on the back side of each of the first and second substrates.

At step 1306, an opening is formed extending through an entire thickness of the second semiconductor substrate from an interconnect structure on a first face of the second semiconductor substrate to a back face of the second semiconductor substrate.

At step 1308, the opening is filled with a ferromagnetic material to form a ferromagnetic core at least partially located within a volume along which inner edges of the first and second coils lie.

At step 1310, the first and second substrates are aligned, so that the first and second coils are in appropriate alignment with each other for connectionless communication. For example in some embodiments, a winding of the IC die (second substrate) overlies a winding of the silicon interposer (first substrate).

At step 1312, the first and second semiconductor substrates and the ferromagnetic core are packaged in a single package.

Figure 14A:
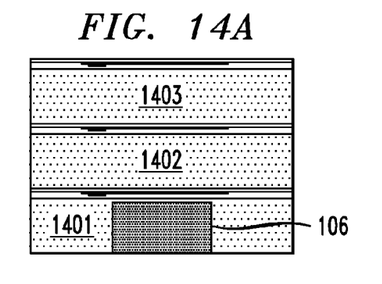
FIGS. 14A-14G are diagrams showing various options for locating the ferromagnetic core within a stack of substrates.
Figure 14B:
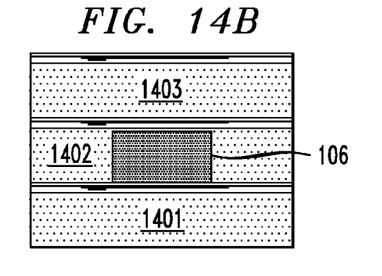
Figure 14C:
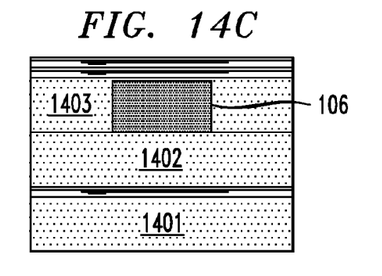
Figure 14D:
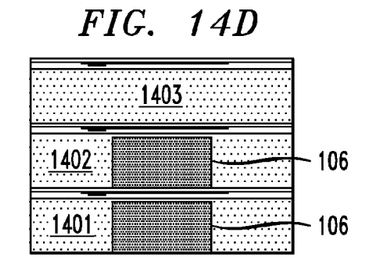
Figure 14E:
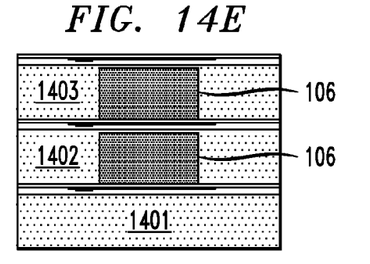
Figure 14F:
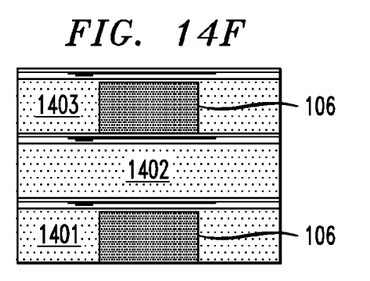
Figure 14G:
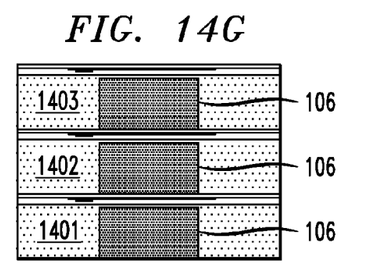

The one or more ferromagnetic cores can be any number at any location with any size. FIGS. 14A-14G provide an example of a stack having three-substrates 1401, 1402 and 1403. FIGS. 14A-14C show examples in which the core 106 can be located in any of the three substrates. FIGS. 14D-14F show examples in which the cores 106 can be located in any two of the three substrates 1401-1403. FIG. 14G is an example in which the cores 106 are located in all three substrates 1401-1403. In a stack having more than three substrates, the ferromagnetic core(s) may be included in any one or more the substrates in the stack.

Various embodiments described above increase the mutual inductance between two coils, permitting connectionless communication with a reduced number of TSVs and microbumps. For example, the structure and method may be used for 2.5D and 3D Stacked IC applications, for chip-to-chip contactless communication, contactless signal probing and power supplying.

In some embodiments, a communications structure, comprises a first semiconductor substrate having a first coil, and a second semiconductor substrate having a second coil above the first semiconductor substrate. Inner edges of the first and second coils define a boundary of a volume that extends below the first coil and above the second coil. A ferromagnetic core is positioned at least partially within the boundary, such that a mutual inductance is provided between the first and second coils for wireless transmission of signals or power between the first and second coils.

In some embodiments, a structure comprises a first semiconductor substrate having a first coil. A ferromagnetic core has a first portion inside or adjacent the first coil.

In some embodiments, a method comprises providing a first semiconductor substrate having a first coil. A second semiconductor substrate is provided having a second coil over the first semiconductor substrate. A ferromagnetic core is provided, at least partially located within a volume along which inner edges of the first and second coils lie, so as to increase a mutual inductance between the first and second coils for wireless transmission of signals or power.

Although the subject matter has been described in terms of exemplary embodiments, it is not limited thereto. Rather, the appended claims should be construed broadly, to include other variants and embodiments, which may be made by those skilled in the art.

What is claimed is:
1. A method comprising:
 providing a first semiconductor substrate having a first coil,
 forming an opening in a back face of a second semiconductor substrate having a second coil;
 providing a ferromagnetic core in the opening,
 joining the second semiconductor substrate over the first semiconductor substrate, such that the ferromagnetic core is at least partially located within a volume along which inner edges of the first and second coils lie, so as to increase a mutual inductance between the first and second coils.
2. The method of claim 1, wherein
 the first semiconductor substrate has a front face and a back face, with a first interconnect structure on the front face, and the first coil is a part of the first interconnect structure; and
 the step of providing the ferromagnetic core includes filling the opening with a ferromagnetic material.

3. The method of claim 2, wherein
 the first semiconductor substrate has a front face, with a first interconnect structure on the front face, and the first coil is a part of the first interconnect structure; and
 the method further includes forming a film of a ferromagnetic material over the first semiconductor substrate.
4. The method of claim 3, wherein
 the second semiconductor substrate has an active face and a back face, with a second interconnect structure on the active face, wherein the second coil is a part of the second interconnect structure, the back face of the second semiconductor substrate facing one of the front and back faces of the first semiconductor substrate; and
 the method further comprising providing a second ferromagnetic core, including forming an opening in a back face of the first semiconductor substrate, and filling the opening with the ferromagnetic material.
5. The method of claim 1, wherein the step of providing the ferromagnetic core includes:
 forming an opening extending through an entire thickness of the first or second semiconductor substrate from an interconnect structure on a first face of the first or second semiconductor substrate to a back face of the first or second semiconductor substrate; and
 filling the opening with a ferromagnetic material.
6. The method of claim 1, further comprising forming a ferromagnetic film in an inter-metal dielectric layer of the first semiconductor substrate during a complementary metal oxide semiconductor (CMOS) back end of line process.
7. The method of claim 1, wherein:
 the first and second semiconductor substrates and the ferromagnetic core are packaged in a single package; and
 the first semiconductor substrate is a silicon interposer, the second semiconductor substrate is an integrated circuit (IC) die, and the packaging step includes aligning the IC die over the silicon interposer, so that a winding of the IC die overlies a winding of the silicon interposer for wireless transmission of signals or power.
8. The method of claim 1, wherein
 the first semiconductor substrate has a front face and a back face, with a first interconnect structure on the front face, and the first coil is a part of the first interconnect structure;
 the opening extends only partially through the second semiconductor substrate; and
 the step of providing the ferromagnetic core includes forming an insert comprising a ferromagnetic material, and placing the insert in the opening.
9. The method of claim 1, further comprising forming a second ferromagnetic core by sputtering a film on a first interconnect structure of the first semiconductor substrate.
10. The method Of claim 9, further comprising:
 forming a third ferromagnetic core in a back face of the first semiconductor substrate, the third ferromagnetic core extending beyond an outer edge of at least one of the group consisting of the first coil and the second coil.
11. The method of claim 1, wherein the step of providing the ferromagnetic core includes sputtering.
12. The method of claim 11, wherein the step of forming the first ferromagnetic material includes etching.
13. A method comprising:
 forming a first core of ferromagnetic material in an interconnect structure of a first substrate having a first coil;
 forming an opening in a back face of a second substrate having a second coil;
 filling the opening with the ferromagnetic material; and aligning the second substrate over the first substrate, with the back face of the second substrate facing the interconnect structure of the first substrate.

14. The method of claim 13, wherein the second substrate has an interconnect structure on an active face of the second substrate opposite the back face, and the step of forming the opening forms the opening so as to extend only partially through a thickness of semiconductor material of the second substrate, the entire second opening being within a perimeter of the second coil.

15. The method of claim 14, wherein the step of forming the first core forms a ferromagnetic film in an inter-metal dielectric layer of the interconnect structure.

16. A method comprising:
providing a first semiconductor substrate having a first coil below a second semiconductor substrate having a second coil above an active side of the second semiconductor substrate, in a plane parallel to a top surface of the second semiconductor substrate; and
providing a ferromagnetic core between the first coil and the second coil, in an opening formed in a back face of the second semiconductor substrate, the back face being opposite the active side of the second semiconductor substrate.

17. The method of claim 16, wherein the ferromagnetic core does not extend beyond a perimeter of the first coil or the second coil.

18. The method of claim 16, further comprising forming a second ferromagnetic core below the first coil.

19. The method of claim 16, further comprising providing a third semiconductor substrate having a third coil below the first semiconductor substrate, the third semiconductor substrate having a second ferromagnetic core below the third coil.

20. The method of claim 19, further comprising providing a third ferromagnetic core between the second coil and the third coil.

* * * * *